United States Patent
Prechtl et al.

(10) Patent No.: US 9,590,048 B2
(45) Date of Patent: Mar. 7, 2017

(54) ELECTRONIC DEVICE

(71) Applicant: Infineon Technologies Austria AG, Villach (AT)

(72) Inventors: Gerhard Prechtl, Rosegg (AT); Clemens Ostermaier, Villach (AT); Oliver Häberlen, Villach (AT)

(73) Assignee: Infineon Technologies Austria AG, Villach (AT)

( * ) Notice: Subject to any disclaimer, the term of this patent is extended or adjusted under 35 U.S.C. 154(b) by 53 days.

(21) Appl. No.: 14/068,640

(22) Filed: Oct. 31, 2013

(65) Prior Publication Data

US 2015/0115326 A1    Apr. 30, 2015

(51) Int. Cl.

| | |
|---|---|
| *H01L 29/66* | (2006.01) |
| *H01L 29/20* | (2006.01) |
| *H01L 29/778* | (2006.01) |
| *H01L 29/872* | (2006.01) |
| *H01L 29/423* | (2006.01) |

(52) U.S. Cl.
CPC .... *H01L 29/2003* (2013.01); *H01L 29/42364* (2013.01); *H01L 29/7786* (2013.01); *H01L 29/7787* (2013.01); *H01L 29/872* (2013.01)

(58) Field of Classification Search
CPC ......... H01L 21/31; H01L 29/42; H01L 29/78; H01L 29/77; H01L 29/40; H01L 21/33
USPC .......... 257/76, 192–194, 256, 471, E21.403, 257/E29.246, E21.615, E27.006, 257/E27.014; 438/172, 591, 12, 285
See application file for complete search history.

(56) References Cited

U.S. PATENT DOCUMENTS

| | | | |
|---|---|---|---|
| 7,696,584 B2 | 4/2010 | Henning et al. | |
| 7,723,752 B2 | 5/2010 | Yoshida et al. | |
| 7,893,461 B2 | 2/2011 | Twynam | |
| 8,183,595 B2 | 5/2012 | Briere | |
| 2006/0043415 A1* | 3/2006 | Okamoto ............ | H01L 29/7787 257/192 |
| 2006/0054925 A1* | 3/2006 | Kikkawa ............ | H01L 29/2003 257/192 |
| 2006/0073621 A1* | 4/2006 | Kneissel .......... | H01L 29/66462 438/21 |
| 2006/0273347 A1* | 12/2006 | Hikita ................. | H01L 29/7786 257/192 |
| 2006/0278892 A1* | 12/2006 | Harris ................. | H01L 29/7783 257/194 |

(Continued)

FOREIGN PATENT DOCUMENTS

DE     102011051670 A1    1/2012

OTHER PUBLICATIONS

Im, et al. "High-Performance GaN-Based Nanochannel FinFETs With/Without AlGaN/GaN Heterostructure." IEEE Transactions on Electron Devices, vol. 60, No. 10. Oct. 2013. pp. 3012-3018.

(Continued)

*Primary Examiner* — Jessica Manno
*Assistant Examiner* — Sheikh Maruf
(74) *Attorney, Agent, or Firm* — Murphy, Bilak & Homiller, PLLC

(57) ABSTRACT

In an embodiment, an electronic device includes a semiconductor layer having a surface, a gate and a first current electrode on the surface and a dielectric layer extending between the gate and the first current electrode and including charged ions having a predetermined charge profile.

26 Claims, 4 Drawing Sheets

(56) References Cited

U.S. PATENT DOCUMENTS

| | | | | |
|---|---|---|---|---|
| 2006/0281238 | A1* | 12/2006 | Harris | H01L 29/7783 438/172 |
| 2007/0224710 | A1* | 9/2007 | Palacios | H01L 29/2003 438/12 |
| 2008/0135880 | A1* | 6/2008 | Yoshida | H01L 29/408 257/194 |
| 2008/0169474 | A1* | 7/2008 | Sheppard | H01L 21/8213 257/76 |
| 2009/0045438 | A1* | 2/2009 | Inoue | H01L 29/155 257/192 |
| 2010/0224861 | A1* | 9/2010 | Jain | B82Y 10/00 257/20 |
| 2011/0018002 | A1* | 1/2011 | Chen | H01L 21/28575 257/76 |
| 2011/0121313 | A1* | 5/2011 | Briere | H01L 29/2003 257/76 |
| 2011/0193096 | A1* | 8/2011 | Imada | H01L 29/7788 257/76 |
| 2012/0019284 | A1 | 1/2012 | Mauder et al. | |
| 2013/0105808 | A1* | 5/2013 | Wong | H01L 29/517 257/76 |
| 2013/0153963 | A1* | 6/2013 | Shealy | H01L 23/291 257/190 |
| 2013/0256686 | A1* | 10/2013 | Kanamura | H01L 29/205 257/76 |
| 2013/0313560 | A1* | 11/2013 | Khalil | H01L 29/402 257/76 |
| 2013/0313611 | A1* | 11/2013 | Khalil | H01L 29/34 257/194 |
| 2013/0313612 | A1* | 11/2013 | Khalil | H01L 29/4236 257/194 |
| 2014/0091373 | A1* | 4/2014 | Simin | G06F 17/5068 257/288 |
| 2014/0151748 | A1* | 6/2014 | Nishimori | H01L 29/42316 257/194 |
| 2014/0159119 | A1* | 6/2014 | Derluyn | H01L 29/66462 257/194 |
| 2014/0346615 | A1* | 11/2014 | Zhang | H01L 21/28158 257/411 |

OTHER PUBLICATIONS

Chen, et al. "Physics of Fluorine Plasma Ion Implantation for GaN Normally-off HEMT Technology." IEDM 2011. IEEE, 2011. pp. 19.4.1-19.4.4.

Uemoto, et al. "Gate Injection Transistor (GIT)—A Normally-Off AlGaN/GaN Power Transistor Using Conductivity Modulation." IEEE Transactions on Electron Devices, vol. 54, No. 12. Dec. 2007. pp. 3393-3393.

Lu, et al. "Tri-Gate Normally-Off GaN Power MISFET." IEEE Electron Device Letters, vol. 33, No. 3. Mar. 2012. pp. 360-362.

Kuraguchi, et al. "Normally-off GaN-MISFET with well-controlled threshold voltage." PSS(a), vol. 204, No. 6. Jun. 2007. pp. 1-4.

Karmalkar, et al. "Enhancement of Breakdown Voltage in AlGaN/GaN High Electron Mobility Transistors Using a Field Plate." IEEE Transactions on Electron Devices, vol. 48, No. 8. Aug. 2011. pp. 1515-1521.

Im, et al. "Heterojunction-Free GaN Nanochannel FinFETs With High Performance." IEEE Electron Device Letters, vol. 34, No. 3. Mar. 2013. pp. 381-383.

* cited by examiner

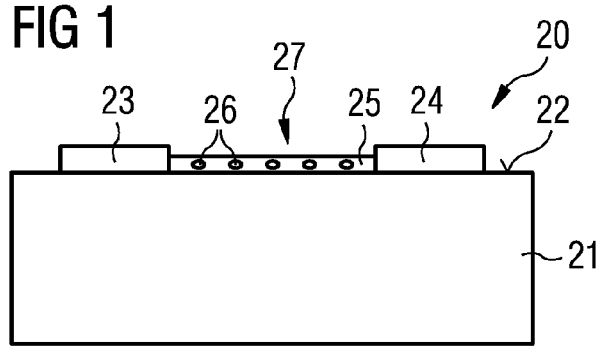
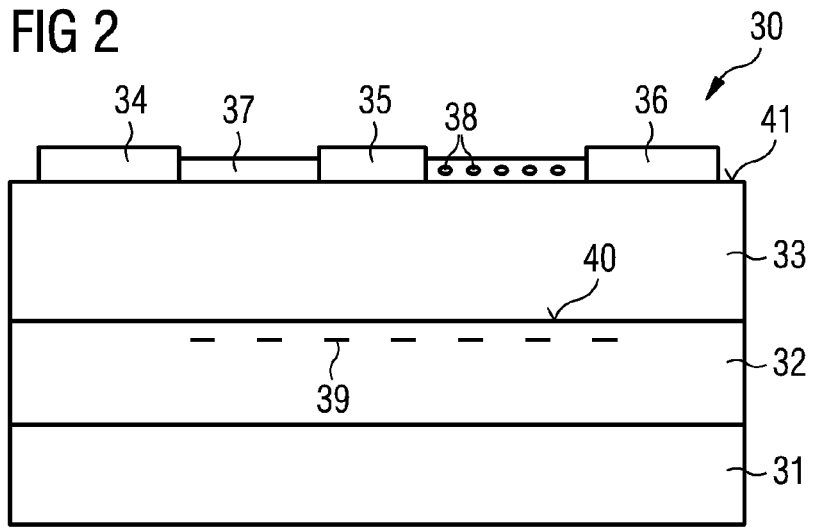
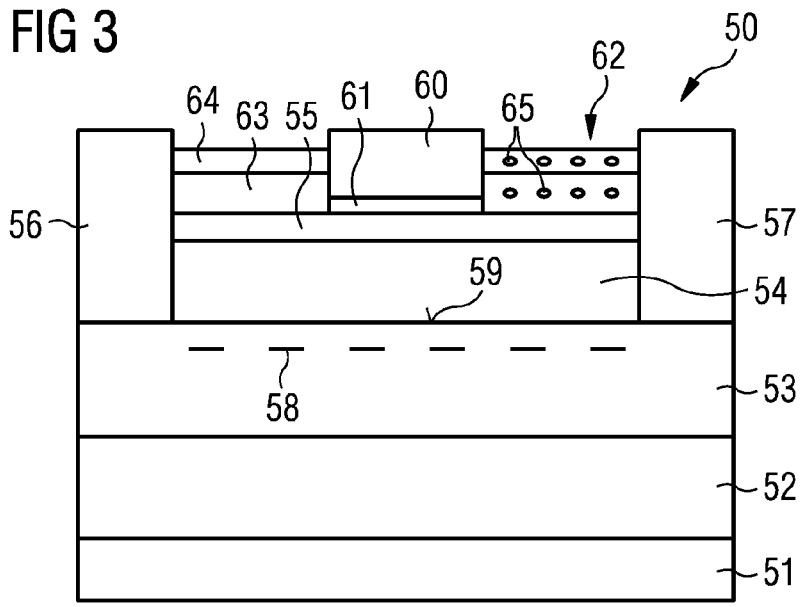

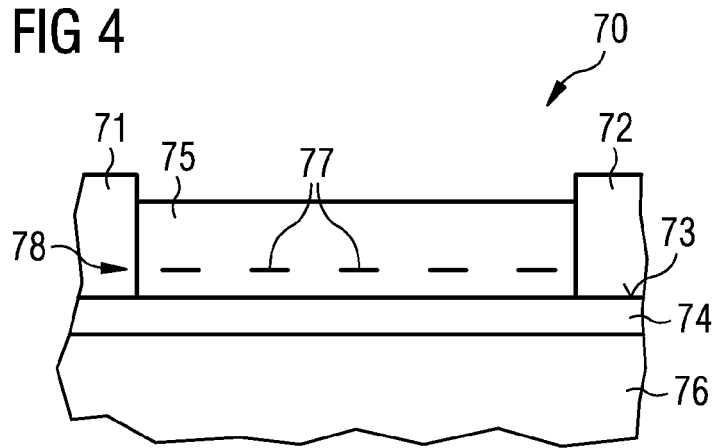
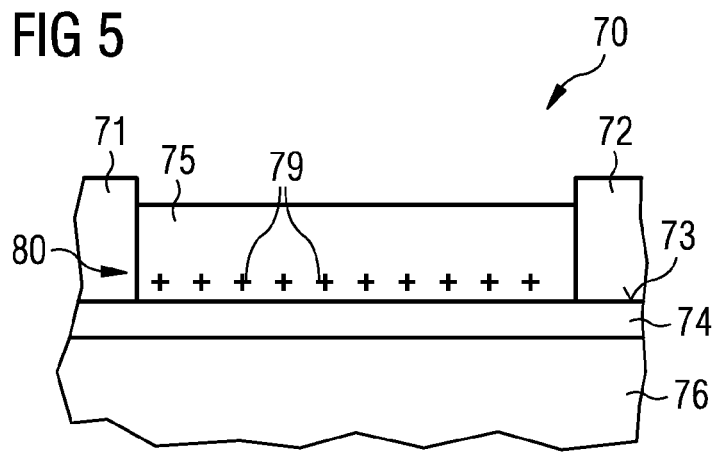
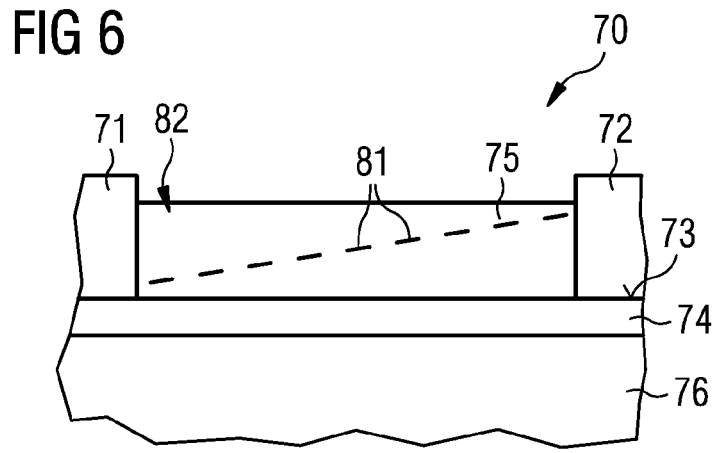

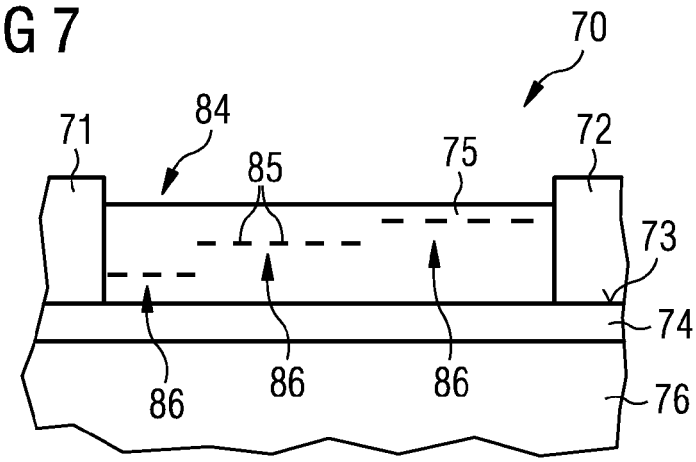
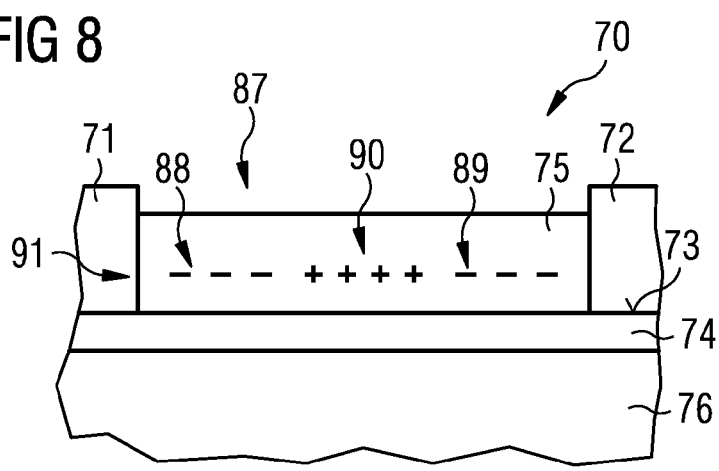
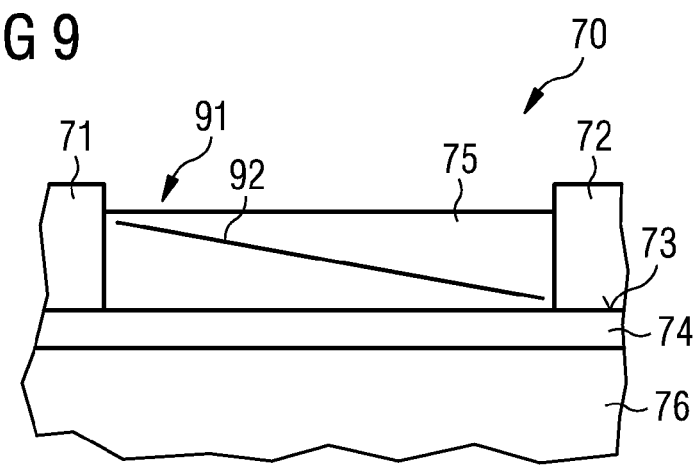

ELECTRONIC DEVICE

BACKGROUND

To date, transistors used in power electronic applications have typically been fabricated with silicon (Si) semiconductor materials. Common transistor devices for power applications include Si CoolMOS™, Si Power MOSFETs, and Si Insulated Gate Bipolar Transistors (IGBTs). Compound semiconductors, for example III-V compound semiconductors such as GaAs are also useful in some applications. More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times.

SUMMARY

In an embodiment, an electronic device includes a semiconductor layer having a surface, a gate and a first current electrode on the surface and a dielectric layer extending between the gate and the first current electrode and including charged ions having a predetermined charge profile.

In an embodiment, an electronic device includes a semiconductor material layer having a surface, an anode and a cathode on the surface and a dielectric layer extending between the anode and the cathode and including charged ions having a predetermined charge profile.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1 illustrates a schematic cross-sectional view of an electronic device according to an embodiment.

FIG. 2 illustrates a schematic cross-sectional view of an electronic device according to an embodiment.

FIG. 3 illustrates a schematic cross-sectional view of an electronic device according to an embodiment.

FIG. 4 illustrates a schematic cross-sectional view of a predetermined charge profile.

FIG. 5 illustrates a schematic cross-sectional view of a predetermined charge profile.

FIG. 6 illustrates a schematic cross-sectional view of a predetermined charge profile.

FIG. 7 illustrates a schematic cross-sectional view of a predetermined charge profile.

FIG. 8 illustrates a schematic cross-sectional view of a predetermined charge profile.

FIG. 9 illustrates a schematic cross-sectional view of a predetermined charge profile.

DETAILED DESCRIPTION

Figure 10:
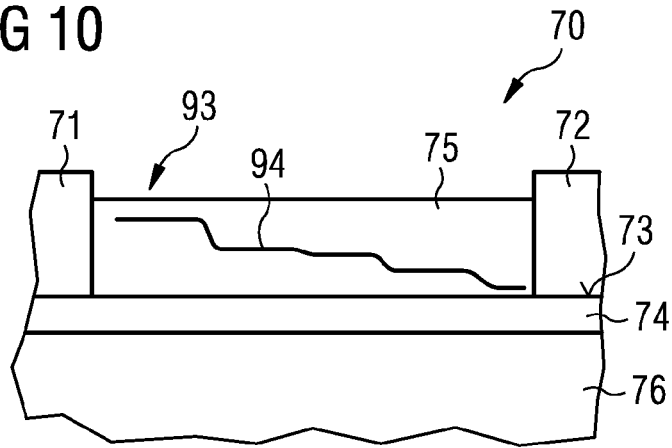
FIG. 10 illustrates a schematic cross-sectional view of a predetermined charge profile.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together—intervening elements may be provided between the "coupled" or "electrically coupled" elements.

As employed in this specification, the term "on" in phrases such as "positioned on" or "arranged on" is not meant to mean that the elements must be directly in contact with one another—intervening elements may be provided between the elements.

A depletion-mode device, such as a high-voltage depletion-mode transistor, has a negative threshold voltage which means that it can conduct current at zero gate voltage. These devices are normally on. And enhancement-mode device, such as a low-voltage enhancement-mode transistor, has a positive threshold voltage which means that it cannot conduct current at zero gate voltage and is normally off.

As used herein, a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, a "low-voltage device", such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

As used herein, the phrase "group III-Nitride" refers to a compound semiconductor that includes nitrogen (N) and at least one group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), for example. Aluminum gallium nitride refers to an alloy described by the formula $Al_xGa_{(1-x)}N$, where x>1.

FIG. 1 illustrates an electronic device 20 including a semiconductor layer 21 having a surface 22, a gate 23 and a first current electrode 24 on the surface 22 and a dielectric layer 25 extending between the gate 23 and the first current electrode 24 and including charged ions 26 having a predetermined charge profile 27.

The first current electrode may be a drain electrode or a source electrode, for example.

The charged ions 26 may be intentionally introduced into the dielectric layer 25 by implantation or by incorporation during vapor phase deposition and may have a density and three-dimensional distribution within the dielectric layer 25 such that a predetermined charge profile 27 is produced which shapes an electric field distribution between the gate 23 and the first current electrode 24. For example, the electric field distribution between the gate 23 and the first current electrode 24 may be more uniformed. In an embodiment, the charged ions 26 are formed in the dielectric layer 25 by damage implantation.

In an embodiment, the charged ions 26 include negatively charged ions, such as one or more of fluorine, chlorine, bromine and iodine. The charged ions 26 may include positively charged ions such as one or more of lithium, sodium, potassium, beryllium, magnesium and calcium. The negatively charged ions may also include aluminium in embodiments in which the dielectric layer 25 includes a suitable material such as $SiO_x$. The charged ions may include negatively charged ions and positively charged ions, each type of charged ion having a different predetermined charge profile.

The dielectric layer 25 may include at least one of silicon nitride, silicon oxide and silicon oxynitride. In some embodiments, the dielectric layer 25 includes an insulating layer and a passivation layer on the insulating layer. The charged ions may be arranged in one or both of the insulating layer and the passivation layer.

The predetermined charge profile 27 may have different forms. The predetermined charge profile 27 may include ions arranged at differing vertical positions within the dielectric layer 35 and have three-dimensional form. The predetermined charge profile 27 may also include a charge density that varies in a direction from the gate 23 to the first current electrode 24.

In an embodiment, the predetermined charge profile is a slanted profile and may increase from the gate 23 to the first current electrode 24. The distance of the charged ions from the surface 22 of the semiconductor layer 21 increases in directions from the gate 23 to the first current electrode 24.

The predetermined charge profile may also have a predetermined charge density gradient, which may decrease in a direction from the gate 23 to the first current electrode 24. The predetermined charge density gradient may decrease gradually from the gate to the first current electrode or may decrease stepwise in a direction from the gate to the first current electrode.

In some embodiments, the first current electrode is a drain electrode and the electronic device includes a second current electrode which may be a source electrode. The charged ions 26 having a predetermined charge profile 27 according to one of the embodiments described above may be positioned only in the dielectric layer 25 extending between the gate 23 and the drain 24.

In some embodiments, the electronic device includes a second current electrode and a further dielectric layer extending between the gate and the second current electrode. The further dielectric layer includes charged ions having a predetermined charge profile. The gate may be positioned between the first current electrode and second current electrode and the charged ions having a predetermined charge profile may be arranged in the dielectric layer extending between the gate and the first current electrode and in the further dielectric layer extending between the gate and the second current electrode. The predetermined profile of the charged ions in the further dielectric layer may be mirror symmetrical to the predetermined profile of the charged ions in the further dielectric layer.

The electronic device 20 may be a transistor, such as a high electron mobility transistor (HEMT). The semiconductor layer may be a compound semiconductor such as a Group III-V semiconductor or may include a Group III-nitride semiconductor such as a gallium nitride semiconductor or an aluminium gallium nitride semiconductor.

The transistor may be a high-voltage device such as a high-voltage HEMT or a low-voltage device. The transistor may be a depletion mode transistor which is normally on or an enhancement mode transistor which is normally off.

In an embodiment, the electronic device includes a semiconductor material layer having a surface and an anode and a cathode on the surface. The electronic device further includes a dielectric layer extending between the anode and cathode that including charged ions having a predetermined charge profile. The charged ions may include negatively charged ions such as fluorine, chlorine, bromine or iodine. The semiconductor material layer may include a Group III nitride semiconductor. The electronic device may be a Schottky barrier diode.

FIG. 2 illustrates a schematic cross-sectional view of an electronic device in the form of a high electron mobility transistor and, in particular, a gallium nitride-based high electron mobility transistor (HEMT) 30.

The gallium nitride-based HEMT 30 includes a substrate 31, a gallium nitride layer 32 arranged on the substrate 31 and an aluminium gallium nitride layer 33 positioned on the gallium nitride layer 32. The gallium nitride-based HEMT 30 further includes a source 34, a gate 35 and a drain 36 arranged on the upper surface 41 of the aluminium gallium nitride layer 33. The gate 35 is arranged laterally between the source 34 and the drain 36. The gallium nitride-based HEMT 30 further includes a dielectric layer 37 which extends between the source 34 and the gate 35 and between the gate 35 and the drain 36 and which is positioned on the aluminium gallium nitride layer 33 in regions between the source 34 and the gate 35 and between the gate 35 and the drain 36. In the region of the dielectric layer 37 extending between the gate 35 and the drain 36, the dielectric layer 37 further includes charged ions 38 having a predetermined charge profile.

The gallium nitride layer 32 may be described as a channel layer and the aluminium gallium nitride layer 33 may be described as a barrier layer. A two-dimensional gas 39 may be formed by spontaneous polarisation or by piezo-electric polarisation at the interface 40 between the gallium nitride layer 32 and the aluminium gallium nitride layer 33 within the gallium nitride layer 32. The gate 35 may be a Schottky gate and the source 34 and the drain 36 may have an ohmic contact to the aluminium gallium nitride layer 33.

The charged ions 38 may be introduced into the dielectric layer 37 extending between the gate 35 and the drain 36 by implantation. These charged ions are trapped within the dielectric layer 37 and are not mobile.

As used herein, a predetermined charge profile includes the three-dimensional form of the charged ions, such as their position within the dielectric layer 37, as well as the charge density within the dielectric layer. Charged ions may include negatively charged ions such as one or more of fluorine, chlorine, bromine and iodine. Negatively charged ions may also be formed by introducing aluminium into a suitable dielectric material such as $SiO_x$. The negatively charged ions may be included in the dielectric layer to shape the electric field distribution between the gate and the drain. For example, the negatively charged ions may be used to provide a more uniform electric field distribution between the gate and the drain.

The dielectric layer 37 may include silicon oxide. The substrate 31 may include sapphire or silicon carbide and a further buffer layer arranged between the sapphire or silicon carbide and the gallium nitride layer 32. The buffer layer may be used to overcome a lattice mismatch between the gallium nitride layer and the substrate 31.

FIG. 3 illustrates a gallium nitride-based HEMT 50 according to an embodiment. The gallium nitride-based HEMT 50 includes a substrate 51 which may be sapphire or silicon carbide, a buffer layer 52 positioned on the substrate 51, a channel layer 53 positioned on the buffer layer 52 and a barrier layer 54 positioned on the channel layer 53 and a gallium nitride cap layer 55 positioned on the barrier layer 54. The channel layer 53 includes gallium nitride and the barrier layer 54 includes aluminium gallium nitride. The gallium nitride cap layer 55 may be used as a protective layer, in particular, to protect the aluminium gallium nitride barrier layer 54 lying underneath.

The gallium nitride-based HEMT 50 further includes a source 56 extending from an outermost surface through the gallium nitride cap layer 55 and the aluminium gallium nitride barrier layer 54 to the gallium nitride cap layer 53. A drain 57 also extends through the gallium nitride cap layer 55 and the aluminium gallium nitride barrier layer 54 to the channel layer 53. In this embodiment, the source 56 and the drain 57 are in direct contact with the gallium nitride of the channel layer 53 in which the two-dimensional gas 58 is formed by spontaneous polarisation or piezoelectric polarisation at the interface 59 between the gallium nitride cap layer 55 and the overlying aluminium gallium nitride barrier layer 54.

The gallium nitride-based HEMT 50 further includes a gate 60 which includes a gate dielectric 61. The gate dielectric 61 is positioned on the gallium nitride cap layer 55 and the gate 60 is positioned on the gate dielectric 61 such that the gate 60 with its gate dielectric 61 is positioned laterally between the source 56 and the drain 57. The gate dielectric 61 may include an oxide. The gallium nitride-based HEMT 50 includes a dielectric layer 62 including an insulating layer 63 which is positioned on the gallium nitride cap layer 55 and which extends between the source 56 and the gate 60 and between the gate 60 and the drain 57. The dielectric layer 62 also includes a passivation layer 64 arranged on the insulating layer which also covers the insulation layer 63 and which extends between the source 56 and the gate 60 and between the gate 60 and the drain 57.

The gallium nitride-based HEMT 50 further includes charged ions 65 which are positioned in both the insulating layer 63 and the passivation layer 64 in the portion of the dielectric layer 62 extending between the gate 60 and the drain 57. The charged ions 65 have a predetermined charge profile having a three-dimensional form and a charge density such that the predetermined charge profile shapes an electric field distribution between the gate 60 and the drain 57. For example, the shaping of the electric field distribution between the gate 60 and the drain 57 may result in a more uniform electric field distribution.

Negatively charged ions within a dielectric layer including silicon oxide may be generated by incorporating e.g. Al, where charge concentrations in the order of $5e^{12}/cm^2$ can be achieved. The Al concentration within the silicon dioxide matrix of the dielectric layer may be in the range of $1e^{17}/cm^3$ to several $1e^{20}/cm^3$.

The arrangement of the negatively charged ions in the dielectric layer extending between the gate and the drain may be used to achieve a reduction in the electric field at the gate edge. If the electric fields at the GaN interface are low this may assist in avoiding dynamic RDSON effects. Furthermore, reduction of the electric field in the dielectric layer may assist in improving reliability, for example reliability criteria in terms of life time requirements.

The negatively charged ions trapped in the dielectric layer may be also used in positions beside the gate for supplying additional field plates or may replace additional field plates. With this technique the charges can be brought very close to the region of the channel layer supporting the two dimensional electron gas, where the highest impact on the electric field redistribution in the dielectric layer and channel layer can be achieved.

The charged ions 26, 38 and 65 included in the electronic devices illustrated in FIGS. 1 to 3 may include positively charged ions or negatively charged ions or a mixture of negatively charged ions and positively charged ions. The charged ions have a three-dimensional form and a charge density within the dielectric layer providing a predetermined charge profile for shaping the electric field distribution between the respective gate and drain of the electronic devices. The predetermined charge profile may have different forms. Examples of possible predetermined charge profiles are illustrated in FIGS. 4 to 11.

In each of FIGS. 4 to 11, a portion of a transistor device 70 is illustrated including a gate 71 and a drain 72 arranged on a surface 73 of a semiconductor layer 74. A dielectric layer 75 is positioned on the surface 73 and extends between the gate 71 and the drain 72. The semiconductor layer 74 is typically one of a plurality of semiconductor layers arranged on a substrate 76. In further embodiments, the drain 72 may be replaced by a source.

In the embodiment illustrated in FIG. 4, the charged ions 77 are negatively charged ions and indicated by "−". The negatively charged ions are arranged in a single layer 78 parallel to the upper surface 73 of the semiconductor layer 74. The layer of negatively charged ions may extend from the gate 71 to the drain 72 or may have a lateral extent such as is spaced at a differential distance from the gate 71 and drain 72 by a portion of the dielectric layer 75.

FIG. 5 illustrates a further arrangement of charged ions 79 between the gate 71 and the drain 72. In this embodiment, the dielectric layer 75 includes positively charged ions which are indicated in FIG. 5 by "+". The positively charged ions are arranged in a single layer 80 which is generally substantially parallel to the upper surface 73 of the semiconductor layer 74 and which extends from the gate 71 to the drain 72.

For the generation of positive charges typically Na, K or other alkali and alkali earth metals embedded in silicon oxide, silicon nitride or silicon oxynitride can be used. The charged ions may be trapped in deep traps in the oxide resulting in a high energy barrier for carriers at room temperature or elevated temperature and under device operation.

FIG. 6 illustrates a further arrangement of charged ions 81 within the dielectric layer 75. In this arrangement, the charged ions 81 are negatively charged ions and indicated in FIG. 6 with "−". In this embodiment, the charged ions have a predetermined charge profile 82 which is slanted and which increases in a direction from the gate 71 towards the drain 72. The height of the charged ions 81 above the surface 73 of the semiconductor layer 74 increases in the direction from the gate 71 towards the drain 72 to form the slanted predetermined charge profile 82.

The charge profile may be slanted so that the predetermined charge profile 82 increases in a linear fashion from the gate 71 to the drain 72. However, the form of the slope from the gate 71 to the drain 72 may also have other forms such as a curved increase or an exponential increase. The slanted charge distribution may enable improved electric field homogenization to be achieved.

FIG. 7 illustrates a further predetermined charge profile 84 including negatively charged ions 85 having a predetermined charge profile which increases in a stepwise fashion from the gate 71 to the drain 72 within the dielectric layer 75. The stepwise form to the predetermined charge profile 84 may be produced by implanting ions within discrete portions of the dielectric layer 75 at different depths. In the example illustrated in FIG. 7, three steps 86 are provided in the predetermined charge profile. However, the stepped predetermined charge profile is not limited to this exact form and may include two or more than three steps.

FIG. 8 illustrates a further predetermined charge profile 87 including negatively charged ions, indicated by "−" and positively charged ions, indicated by "+". In this particular embodiment, a first region 88 of negatively charged ions is arranged adjacent the gate 71 and a second region 89 of negatively charged ions adjacent the drain 72 and a region 90 of positively charged ions is arranged between the two regions 88, 89 of negatively charged ions. In this embodiment, the two regions 88, 89 of negatively charged ions and the region 90 of positively charged ions are arranged in a common layer 91.

If positively charged ions are used in the passivation between the gate and drain region, this may result in the two dimensional electron gas located below this region including positively charged ions to be increased (charge neutrality) and the resulting RON will be decreased accordingly. One effect of this may be to allow shrinkage of the device structure.

The electric field may be tailored by the use of alternating regions including negatively charged ions and positively charged ions. For example, the electric field may be increased in regions where the electric field is less critical by the arrangement of positively charged ions in the dielectric layer leading to lower RON. Negatively charged ions may be incorporated into the dielectric layer at regions with high electric fields, for example adjacent the gate and adjacent the drain, to decrease the corresponding electric fields, for example at the gate and drain edge. This combination may be used to provide a tailored device, in terms of RON*A and device reliability, for example.

FIG. 9 illustrates a further predetermined charge profile 91 including charged ions having a charge density. The charge density of the charged ions decreases in a direction from the gate 71 to the drain 72 as is schematically illustrated in FIG. 9 by the line 92. In the embodiment illustrated in FIG. 9, the charge density decreases in a linear fashion from the gate 71 to the drain 72.

FIG. 10 illustrates a further predetermined charge profile 93 including charged ions having a charge density. The charge density of the charged ions decreases in a direction from the gate 71 to the drain 72 as is schematically illustrated in FIG. 10 by the line 94. In the embodiment illustrated in FIG. 10, the charge density decreases in a stepped fashion from the gate 71 to the drain 72.

Figure 11:
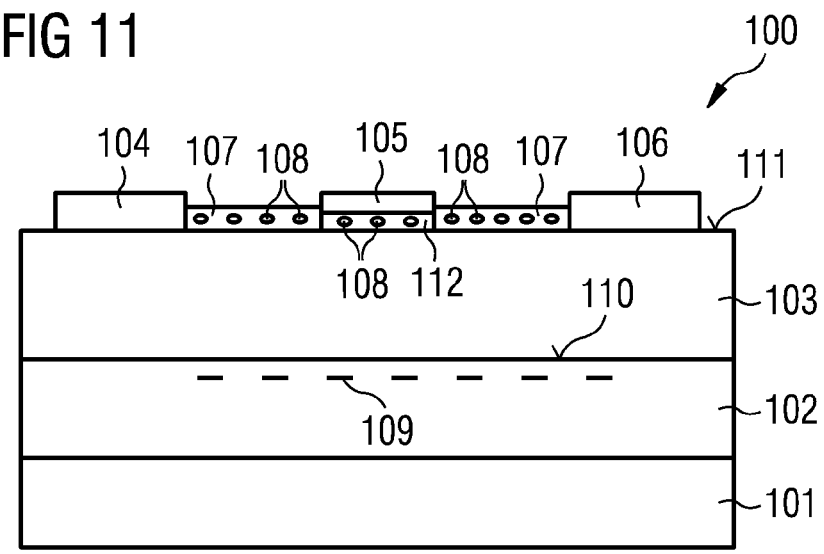
FIG. 11 illustrates a schematic cross-sectional view of an electronic device according to an embodiment.

FIG. 11 illustrates a schematic cross-sectional view of an electronic device in the form of a high electron mobility transistor and, in particular, a gallium nitride-based high electron mobility transistor (HEMT) 100.

The gallium nitride-based HEMT 100 includes a substrate 101, a gallium nitride layer 102 arranged on the substrate 101 and an aluminium gallium nitride layer 103 positioned on the gallium nitride layer 102. The gallium nitride-based HEMT 100 further includes a source 104, a gate 105 and a drain 106 arranged on the upper surface 111 of the aluminium gallium nitride layer 103. The gate 105 is arranged laterally between the source 104 and the drain 106. The gallium nitride-based HEMT 100 further includes a dielectric layer 107 which in a first region extends between the gate 105 and the drain 106 and in a second region extends between the source 104 and the gate 105. The dielectric layer 107 is positioned on the aluminium gallium nitride layer 103 in regions between the source 104 and the gate 105 and between the gate 105 and the drain 106. The dielectric layer 107 further includes charged ions 108 having a predetermined charge profile. The charged ions 108 are arranged in the dielectric layer 107 not only in the first region extending between the gate 105 and the drain 106, but also in the second regions extending between the gate 105 and the source 104. The charged ions 108 are trapped within the dielectric layer 107 and are not mobile.

As used herein, a predetermined charge profile includes the three-dimensional form of the charged ions 108, such as their position within the dielectric layer 107, as well as the charge density within the dielectric layer 107. The position of the charged ions 108 within the dielectric layer 107 may increase in a direction from the gate 105 towards the source 104 and may increase in a direction from the gate 105 towards the drain 106. The charge density of the charged ions 108 within the dielectric layer 107 may decrease in a direction from the gate 105 towards the source 104 and may decrease in a direction from the gate 105 towards the drain 106.

The gallium nitride layer 102 may be described as a channel layer and the aluminium gallium nitride layer 103 may be described as a barrier layer. A two-dimensional gas 109 may be formed by spontaneous polarisation or by piezoelectric polarisation at the interface 110 between the gallium nitride layer 102 and the aluminium gallium nitride layer 103 within the gallium nitride layer 102. The source 104 and the drain 106 may have an ohmic contact to the aluminium gallium nitride layer 103. The gate 105 includes a gate dielectric 112 which is positioned between the gate 105 and the aluminium gallium nitride layer 103. Charged ions 108 may also be positioned in the gate dielectric 112.

The use of the dielectric layer extending between two electrodes, such as a gate and a drain or a gate and a source, and including charged ions having a predetermined charge profile may also be used for other types of electronic devices and is not limited to a transistor device or high electron mobility transistor device.

Figure 12:
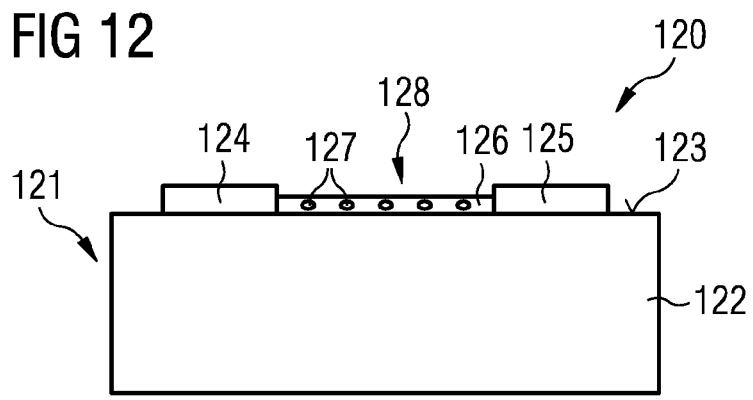
FIG. 12 illustrates a schematic cross-sectional view of an electronic device according to an embodiment.

FIG. 12 illustrates an electronic device 120 which includes a diode, in particular a Schottky barrier diode 121. The electronic device 120 includes a semiconductor material layer 122 having a surface 123, an anode 124 and a cathode 125 arranged on the surface 123. A dielectric layer 126 extends between the anode 124 and the cathode 125. The dielectric layer 126 includes charged ions 127 having a predetermined charge profile 108.

The charged ions 127 may be negatively charged ions such as one or more of fluorine, chlorine, bromine and iodine. The semiconductor material layer 122 may include a Group III nitride semiconductor, such as a gallium nitride-based semiconductor. The predetermined charge profile 128 of the charged ions 127 may have any one of the forms illustrated in FIGS. 4 to 11. The dielectric layer may be one or more of silicon nitride, silicon oxide and silicon oxynitride. The dielectric layer 126 is not limited to a single layer but may include two or more layers, such as an insulating layer and passivation layer positioned on the insulating layer.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A high electron mobility transistor (HEMT) electronic device, comprising:
   a semiconductor layer having a surface, wherein the semiconductor layer comprises a gallium nitride layer, an aluminum gallium nitride layer above the gallium nitride layer, and a gallium nitride cap layer on the aluminum gallium nitride layer;
   a gate and a first current electrode on the surface, wherein the gate is arranged laterally between a source and a drain of the HEMT; and
   a dielectric layer on the surface of the semiconductor layer and extending laterally between the gate and the first current electrode and comprising charged ions having a predetermined charge profile which shapes an electric field distribution between the gate and the first current electrode so as to make the electric field distribution more uniform between the gate and the first current electrode,
   wherein the dielectric layer comprises a first region positioned on the aluminum gallium nitride layer between the source and the gate, a second region positioned on the aluminum gallium nitride layer between the gate and the drain, an insulating layer on the gallium nitride cap layer which extends between the source and the gate and between the gate and the drain, and a passivation layer arranged on the insulating layer which extends between the source and the gate and between the gate and the drain,
   wherein the charged ions are disposed in at least the second region of the dielectric layer extending between the gate and the drain.

2. The electronic device of claim 1, wherein the charged ions comprise negatively charged ions.

3. The electronic device of claim 2, wherein the negatively charged ions comprise at least one of Fluorine (F), Chlorine (Cl), Bromine (Br), Iodine (I), Aluminum (Al).

4. The electronic device of claim 1, wherein the charged ions comprise positively charged ions.

5. The electronic device of claim 4, wherein the positively charged ions comprise at least one of Lithium (Li), Sodium (Na), Potassium (K), Beryllium (Be), Magnesium (Mg), Calcium (Ca).

6. The electronic device of claim 1, wherein the charged ions comprise negatively charged ions and positively charged ions.

7. The electronic device of claim 1, wherein the dielectric layer comprises at least one of silicon nitride, silicon oxide, silicon oxynitride.

8. The electronic device of claim 1, wherein the charged ions are arranged in at least one of the insulating layer and the passivation layer.

9. The electronic device of claim 1, wherein the predetermined charge profile is a slanted profile.

10. The electronic device of claim 1, wherein the predetermined charge profile has a predetermined charge density gradient.

11. The electronic device of claim 10, wherein the charge density gradient decreases in a direction from the gate to the first current electrode.

12. The electronic device of claim 10, wherein the charge density gradient decreases stepwise in the direction from the gate to the first current electrode.

13. The electronic device of claim 1, wherein the first current electrode is one of the group consisting of the source and the drain.

14. The electronic device of claim 1, further comprising a second current electrode and a further dielectric layer extending between the gate and the second current electrode, the further dielectric layer comprising charged ions having a predetermined charge profile.

15. The electronic device of claim 1, wherein the semiconductor layer comprises one of the group consisting of a compound semiconductor, a group III-V semiconductor and a group III-Nitride semiconductor.

16. The electronic device of claim 1, wherein the electronic device is a depletion mode HEMT.

17. The electronic device of claim 1, wherein the charged ions are absent under the gate.

18. The electronic device of claim 1, wherein the dielectric layer comprises silicon nitride and the charged ions are disposed in the silicon nitride.

19. The electronic device of claim 1, wherein the charged ions are disposed in the dielectric layer such that the predetermined charge profile extends over an entire distance between the gate and the first current electrode.

20. The electronic device of claim 1, wherein the electronic device is devoid of a gate dielectric under the gate.

21. The electronic device of claim 1, further comprising a gate dielectric under the gate, wherein the dielectric layer is made of a different material than the gate dielectric.

22. The electronic device of claim 1, further comprising a gate dielectric under the gate, wherein the dielectric layer is thicker than the gate dielectric.

23. The electronic device of claim 1, wherein the source and the drain extend through the aluminium gallium nitride layer to the gallium nitride layer.

24. The electronic device of claim 1, wherein the charged ions are disposed in both the insulating layer and the passivation layer of the dielectric layer in the second region of the dielectric layer extending between the gate and the drain.

25. The electronic device of claim 1, wherein the charged ions are disposed in both the first region of the dielectric layer extending between the source and the gate and the second region of the dielectric layer extending between the gate and the drain.

26. The electronic device of claim 25, wherein the charged ions are also disposed in a gate dielectric that separates the gate from the aluminium gallium nitride layer.

* * * * *